United States Patent
Ohtsuka et al.

(10) Patent No.: US 9,629,239 B2
(45) Date of Patent: Apr. 18, 2017

(54) RESIN COMPOSITION, AND PREPREG AS WELL AS LAMINATE USING THE SAME

(75) Inventors: Hajime Ohtsuka, Kamisu (JP); Daisuke Ueyama, Tokyo (JP); Masanobu Sogame, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 14/001,752

(22) PCT Filed: Mar. 5, 2012

(86) PCT No.: PCT/JP2012/055600
§ 371 (c)(1),
(2), (4) Date: Aug. 27, 2013

(87) PCT Pub. No.: WO2012/121224
PCT Pub. Date: Sep. 13, 2012

(65) Prior Publication Data
US 2013/0337269 A1 Dec. 19, 2013

(30) Foreign Application Priority Data
Mar. 7, 2011 (JP) .................. 2011-048505

(51) Int. Cl.
| | | |
|---|---|---|
| H05K 1/03 | (2006.01) |
| C08G 59/40 | (2006.01) |
| C08K 3/00 | (2006.01) |
| H05K 1/05 | (2006.01) |
| C08J 5/24 | (2006.01) |
| B32B 15/092 | (2006.01) |
| B32B 15/14 | (2006.01) |
| B32B 15/20 | (2006.01) |
| B32B 27/20 | (2006.01) |
| B32B 27/26 | (2006.01) |
| C08K 9/02 | (2006.01) |
| C08K 3/38 | (2006.01) |

(52) U.S. Cl.
CPC ......... *H05K 1/0373* (2013.01); *B32B 15/092* (2013.01); *B32B 15/14* (2013.01); *B32B 15/20* (2013.01); *B32B 27/20* (2013.01); *B32B 27/26* (2013.01); *C08G 59/4014* (2013.01); *C08J 5/24* (2013.01); *C08K 3/0033* (2013.01); *C08K 3/38* (2013.01); *C08K 9/02* (2013.01); *H05K 1/056* (2013.01); *B32B 2262/101* (2013.01); *B32B 2264/102* (2013.01); *B32B 2264/104* (2013.01); *B32B 2307/302* (2013.01); *B32B 2307/3065* (2013.01); *B32B 2457/08* (2013.01); *C08K 2003/387* (2013.01); *Y10T 428/31529* (2015.04)

(58) Field of Classification Search
None
See application file for complete search history.

(56) References Cited

U.S. PATENT DOCUMENTS

| | | |
|---|---|---|
| 2008/0187763 A1 | 8/2008 | Kato et al. |
| 2009/0017316 A1 | 1/2009 | Kato et al. |
| 2015/0034369 A1* | 2/2015 | Kashima et al. ............. 174/255 |

FOREIGN PATENT DOCUMENTS

| | | |
|---|---|---|
| CN | 101343412 | 1/2009 |
| JP | 2000-169137 | 6/2000 |
| JP | 2000-223807 | 8/2000 |
| JP | 2001-122615 | 5/2001 |
| JP | 2001-348488 | 12/2001 |
| JP | 2006-193607 | 7/2006 |
| JP | 2006-348187 | 12/2006 |
| JP | 2007-45968 | 2/2007 |
| JP | 2007-45984 | 2/2007 |
| JP | 2008-214602 | 9/2008 |
| JP | 2009-35728 | 2/2009 |
| JP | 2010-47450 | 3/2010 |
| JP | 2010-59025 | 3/2010 |
| JP | 2010-229368 | 10/2010 |
| JP | 2011-12193 | 1/2011 |
| TW | 200848257 | 12/2008 |

OTHER PUBLICATIONS

Otsuka et al., JP2000-223807 machine translation. Aug. 11, 2000.*
International Search Report issued in JP/2012/055600, in English, issued May 22, 2012.

* cited by examiner

*Primary Examiner* — Coris Fung
(74) *Attorney, Agent, or Firm* — Greenblum & Bernstein, P.L.C.

(57) ABSTRACT

A resin composition is provided which can be suitably used in a printed wiring board having high glass transition temperature, high copper foil peel strength, heat resistance in moisture absorption, flame resistance, resistance to soldering heat, low water absorption and high heat dissipation characteristics, and a prepreg using the resin composition, and a laminate as well as a metal foil-clad laminate using the prepreg. There is used a resin composition including an epoxy resin (A), a curing agent (B), a first filler (C), a second filler (D) and a wetting dispersant (E), wherein the first filler (C) is borate particles coated with hexagonal boron nitride.

11 Claims, No Drawings

RESIN COMPOSITION, AND PREPREG AS WELL AS LAMINATE USING THE SAME

TECHNICAL FIELD

The present invention relates to a resin composition and, more particularly, to a resin composition which can be suitably used in a printed wiring board having high thermal conductivity. Furthermore, the present invention relates to a prepreg prepared by using the resin composition, and a laminate as well as a metal foil-clad laminate using the prepreg.

BACKGROUND ART

A printed wiring board mounted on an electronic device requires a micro wiring technology and a high density mounting technology associated with miniaturization of an electronic device, while it requires a technology for high heat dissipation corresponding to heat generation. Particularly, an electronic circuit in a vehicle or the like using a large current for various types of controls/operations has a very large heat generation caused by the resistance of a conductive circuit or from a power module, and thus requires high heat dissipation characteristics besides high copper foil peel strength, heat resistance in moisture absorption, resistance to soldering heat and low water absorption which have been needed for conventional printed wiring boards.

A thermosetting resin itself such as an epoxy resin used in an insulating layer of a printed wiring board has a low thermal conduction. Hence, there is known a method by which a thermosetting resin is highly filled with an inorganic filler having excellent thermal conduction property in order to enhance the thermal conduction as a printed wiring board (see, for example, Patent Literature 1).

However, problems caused by highly filling a thermosetting resin composition with an inorganic filler are that the processability of the resin composition becomes deteriorated, that the resin composition becomes brittle or expensive, or the like. On top of that, a problem is that since the volume ratio of the thermosetting resin becomes lower, which facilitates the occurrence of cracks and voids between the resin and the inorganic filler, moisture-resistant characteristics (water absorption rate and heat resistance in moisture absorption) and resistance to soldering heat are reduced, and further the adhesion between the resin and the inorganic filler becomes insufficient, leading to reduced copper foil peel strength.

Meanwhile, as an inorganic filler having excellent thermal conduction property, boron nitride is known (see, for example, Patent Literature 2), and Examples of Patent Literature 2 use boron nitride ("UHP-2" SHOWA DENKO K.K.), which is commercially available as hexagonal boron nitride. It is known that the hexagonal boron nitride excels in electrical insulation properties and chemical stability besides thermal conduction property, and is non-toxic and comparatively inexpensive. However, it is known that the hexagonal boron nitride grows in the a-axis direction (direction of a hexagonal mesh surface), but does not grow in the c-axis direction (direction of a pile) as the particle size becomes larger. Thus, it is known that, in the case where a general silane coupling agent is used, the effect by using a silane coupling agent could not be achieved due to less functional groups with respect to the flattened surfaces. Although Patent Literature 2 reports that moisture-resistant characteristics (heat resistance in moisture absorption), which are needed for a printed wiring board use can be improved by using a silane coupling agent having a specific functional group, the technique lacks versatility and effects thereof are definite.

Further, Patent Literature 3 describes that the heat conductivity of a substrate can be improved by using magnesium and/or calcium borate particles covered with hexagonal boron nitride in place of scale-like hexagonal boron nitride. However, the resins used in Examples of the Literature are only an epoxy resin having a common structure, and the substrate obtained by curing it could not be said to have sufficient characteristics in terms of high glass transition temperature, high copper foil peel strength, heat resistance in moisture absorption, resistance to soldering heat, water absorption rate and flame resistance which are needed for a printed wiring board use.

Furthermore, in Patent Literature 4, a resin composition characterized in that either or both of an epoxy resin and a curing agent has a naphthalene structure, an inorganic filler contains hexagonal boron nitride, and the inorganic filler is contained at 50 to 85% by volume of the entire resin composition is cured to make a sheet or a substrate. However, the use of the cured material described in the Literature is a heat dissipation sheet, and thus could not be said to have sufficient characteristics in terms of high glass transition temperature, high copper foil peel strength, heat resistance in moisture absorption, resistance to soldering heat, water absorption rate and flame resistance, which are needed for a printed wiring board use.

CITATION LIST

Patent Literature

Patent Literature 1: Japanese Patent Laid-Open No. 2001-348488
Patent Literature 2: Japanese Patent Laid-Open No. 2010-229368
Patent Literature 3: Japanese Patent Laid-Open No. 2000-223807
Patent Literature 4: Japanese Patent Laid-Open No. 2011-12193

SUMMARY OF INVENTION

Technical Problem

The present invention has been made in light of the aforementioned background art, and an object thereof is to provide a resin composition for a printed wiring board having high glass transition temperature, copper foil peel strength, heat resistance in moisture absorption, resistance to soldering heat, low water absorption, flame resistance, low coefficient of thermal expansion and high heat dissipation characteristics, which are needed for a printed wiring board use, and a prepreg using the resin composition, and a laminate as well as a metal foil-clad laminate using the prepreg.

Solution to Problem

As a result of keen study, the present inventors have found the aforementioned problem to be solved by using a resin composition comprising an epoxy resin (A), a curing agent (B), a first filler (C), a second filler (D) and a wetting dispersant (E), wherein the first filler (C) is borate particles coated with hexagonal boron nitride, and completed the present invention.

That is to say, the inventions of 1 to 15 listed below are provided.
1. A resin composition comprising:
an epoxy resin (A);
a curing agent (B);
a first filler (C);
a second filler (D); and
a wetting dispersant (E),
wherein the first filler (C) is borate particles coated with hexagonal boron nitride.
2. The resin composition according to 1, wherein the borate particles are magnesium or calcium borate particles.
3. The resin composition according to 1 or 2, wherein the curing agent (B) is represented by the following general formula (II):

[Formula 1]

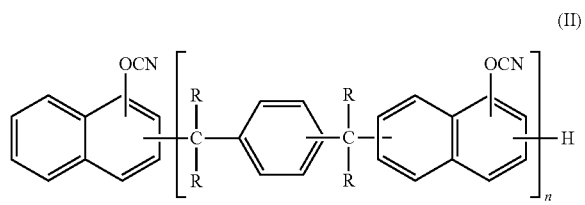

(II)

wherein R represents a hydrogen atom or a methyl group, and n represents an integer of 1 to 50.
4. The resin composition according to any one of 1 to 3, wherein the epoxy resin (A) is represented by the following general formula (I):

[Formula 2]

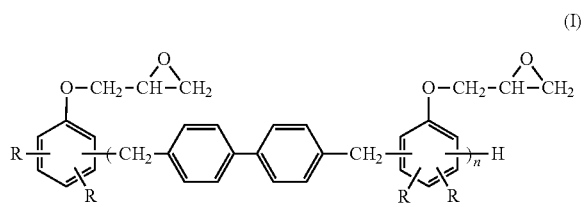

(I)

wherein a plurality of R are each independently present and represent a hydrogen atom, an alkyl group having 1 to 5 carbon atoms or a phenyl group; and n is an average value and represents 1<n≤20.
5. The resin composition according to any one of 1 to 4, wherein the second filler (D) is at least one selected from the group consisting of alumina, magnesium oxide, magnesium carbonate, magnesium hydroxide, aluminum nitride, aluminum hydroxide, boehmite, titanium oxide, zinc oxide, silica and talc.
6. The resin composition according to any one of 1 to 5, wherein an average particle size ($D_{50}$) of the second filler (D) is 0.1 to 10 μm.
7. The resin composition according to any one of 1 to 6, further comprising a silane coupling agent.
8. The resin composition according to any one of 1 to 7, wherein a content of the first filler (C) is 1 to 400 parts by mass based on 100 parts by mass of a total of the epoxy resin (A) and the curing agent (B).
9. The resin composition according to any one of 1 to 8, wherein a content of the second filler (D) is 1 to 700 parts by mass based on 100 parts by mass of a total of the epoxy resin (A) and the curing agent (B).
10. The resin composition according to any one of 1 to 9, wherein the wetting dispersant (E) comprises a copolymer containing at least one functional group comprising an acid group.
11. The resin composition according to any one of 1 to 10, wherein the wetting dispersant (E) is a polymer wetting dispersant having an acid value of 20 to 200 mgKOH/g.
12. The resin composition according to any one of 1 to 11, wherein a content of the wetting dispersant (E) is 0.1 to 20 parts by mass based on 100 parts by mass of a total of the components (A) to (D).
13. A prepreg formed by impregnating a base material (F) with the resin composition according to any one of 1 to 12 or applying the resin composition according to any one of 1 to 12 onto a base material (F).
14. A laminate formed by laminate-molding the prepreg according to 13.
15. A metal foil-clad laminate formed by laminate-molding the prepreg according to 13 and a metal foil.

Advantageous Effects of Invention

A resin composition according to the present invention has excellent curability, and a laminate and a metal foil-clad laminate formed by curing the resulting prepreg have high glass transition temperature, have excellent peel strength, resistance to soldering heat, heat resistance in moisture absorption, water absorption rate and flame resistance, and have high thermal conduction property. As a result, the resin composition is suitable for a printed wiring board material corresponding to an increased high density, and has extremely high industrial usefulness.

DESCRIPTION OF EMBODIMENTS

Embodiments of the present invention will hereinafter be described. It is to be noted that the following embodiments are to be considered as an illustrative example to explain the present invention and that the present invention is not limited only to those embodiments.

Resin Composition

A resin composition according to the present invention comprises an epoxy resin (A), a curing agent (B), a first filler (C), a second filler (D) and a wetting dispersant (E), wherein the first filler (C) is borate particles coated with hexagonal boron nitride. The resin composition may further comprise other components such as a silane coupling agent and a maleimide compound. The resin composition according to the present invention is suitably used to prepare a prepreg for a printed wiring board. Each component constituting the resin composition will hereinafter be described.

Epoxy Resin (A)

An epoxy resin (A) used in the present invention is not particularly limited as long as it is a compound having two or more epoxy groups in one molecule. Examples thereof include a bisphenol A-based epoxy resin, a bisphenol F-based epoxy resin, a phenol novolac-based epoxy resin, a cresol novolac-based epoxy resin, a bisphenol A novolac-based epoxy resin, a brominated bisphenol A-based epoxy resin, a brominated phenol novolac-based epoxy resin, a trifunctional phenol-based epoxy resin, a tetrafunctional phenol-based epoxy resin, a naphthalene-based epoxy resin, a biphenyl-based epoxy resin, a phenol aralkyl-based epoxy resin, a biphenyl aralkyl-based epoxy resin, a naphthol aralkyl-based epoxy resin, an alicyclic epoxy resin, a polyol-based epoxy resin, a phosphorous-containing epoxy resin, glycidyl amine, glycidyl ester, a compound obtained by epoxidation of a double bond of butadiene or the like, and a compound obtained by reaction of a hydroxyl group-containing silicone resins with epichlorohydrin. Examples of a preferred epoxy resin include a bisphenol A-based epoxy resin, a bisphenol F-based epoxy resin, a phenol novolac-based epoxy resin, a cresol novolac-based epoxy resin, a bisphenol A novolac-based epoxy resin, a brominated bisphenol A-based epoxy resin, a brominated phenol novolac-based epoxy resin, a biphenyl-based epoxy resin, a phenol aralkyl-based epoxy resin, a biphenyl aralkyl-based epoxy resin and a naphthol aralkyl-based epoxy resin. These epoxy resins may be used alone or by mixing two or more kinds thereof, as appropriate. Among these epoxy resins, the biphenyl aralkyl-based epoxy resin represented by general formula (I) and a naphthol aralkyl-based epoxy resin are particularly preferable because of an excellent balance of flame resistance, water absorption rate, adhesion, coefficient of thermal expansion, dielectric constant, insulation properties, heat resistance, moisture resistance or the like.

[Formula 3]

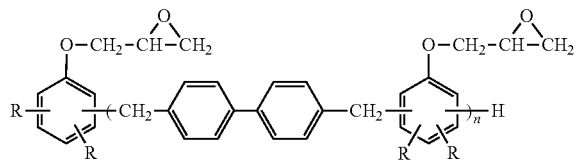

(I)

wherein a plurality of R are each independently present, and represent a hydrogen atom, an alkyl group having 1 to 5 carbon atoms or a phenyl group; and n is an average value and represents $1 < n \leq 20$.

The content of the epoxy resin (A) is not particularly limited, but is preferably 10 to 90 parts by mass, and more preferably 30 to 70 parts by mass based on 100 parts by mass of a total of the epoxy resin (A) and the curing agent (B) from the viewpoint of flame resistance, water absorption rate, adhesion, coefficient of thermal expansion, dielectric constant, insulation properties, heat resistance, moisture resistance or the like.

Curing Agent (B)

Examples of the curing agent (B) used in the present invention include a phenol resin, a bismaleimide triazine resin (BT resin), an acid anhydride, amine and a cyanate ester resin. Particularly preferable is a cyanate ester resin, the resultant cured material of which has high glass transition temperature and which gains a balance of flame resistance, water absorption rate, adhesion, coefficient of thermal expansion, dielectric constant, insulation properties, heat resistance, moisture resistance or the like.

The phenol resin used as the curing agent (B) in the present invention is not particularly limited as long as it is a resin having two or more phenolic hydroxyl groups in one molecule. Examples thereof include a phenol novolac resin, an alkylphenol novolac resin, a bisphenol A novolac resin, a dicyclopentadiene-based phenol resin, a Xylok-based phenol resin, a terpene-modified phenol resin, polyvinylphenols and an aralkyl-based phenol resin, and it is preferably a compound in which two or more hydrogen atoms bonded to an aromatic ring in one molecule are substituted with hydroxyl groups. The phenol resin may be used alone or in combinations of two or more thereof.

When a phenol resin is used as the curing agent (B), the equivalent ratio (phenolic hydroxyl group/epoxy group, molar ratio) of a hydroxyl group of the phenol resin to an epoxy group of the epoxy resin (A) is preferably 0.3 to 1.5, more preferably 0.4 to 1.0, and further more preferably 0.5 to 1.0 from the viewpoint of curability, adhesion, preservation stability or the like.

The BT resin used as the curing agent (B) in the present invention is not particularly limited as long as it is a resin in which a maleimide compound and a cyanate ester compound are used as main components, and pre-polymerized. Examples thereof include a resin obtained by heat-melting 2,2-bis(4-cyanatophenyl)propane (CX, Mitsubishi Gas Chemical Company, Inc.) and bis(3-ethyl-5-methyl-4-maleimidephenyl)methane (BMI-70: K.I CHEMICAL INDUSTRY CO., LTD.) to cause polymerization reaction thereof, and a resin obtained by heat-melting a novolac-based cyanate ester resin (Primaset PT-30, Lonza Japan Ltd., cyanate equivalent: 124 g/eq.) and bis(3-ethyl-5-methyl-4-maleimidephenyl)methane (BMI-70: K.I CHEMICAL INDUSTRY CO., LTD.) to cause polymerization reaction thereof and to further cause dissolution thereof in methyl ethyl ketone.

Among these resins, the BT resin containing a naphthol aralkyl-based cyanate ester compound has features that the resin skeleton is a rigid structure, whereby heat resistance can be maintained, and also has characteristics that a reaction inhibition factor is reduced to enhance the curability and to provide excellent water absorption and heat resistance, whereby can be suitably used. The cyanate ester compound which is a raw material for the BT resin may be used alone or by mixing two or more kinds thereof, as appropriate.

Examples of the acid anhydride used as the curing agent (B) in the present invention include methylcyclohexanetetracarboxylic dianhydride, trimellitic anhydride, pyromellitic anhydride, benzophenonetetracarboxylic dianhydride and ethylene glycol bis-anhydro trimellitate. These may be used singly or in combinations of two or more thereof.

When an acid anhydride is used as the curing agent (B), the equivalent ratio (acid anhydride group/epoxy group, molar ratio) of an acid anhydride group of the acid anhydride to an epoxy group of the epoxy resin (A) is preferably 0.3 to 1.5, more preferably 0.4 to 1.0, and further more preferably 0.5 to 1.0 from the viewpoint of curability, adhesion, preservation stability or the like.

Examples of the amine used as the curing agent (B) in the present invention include dicyandiamide, diaminodiphenylmethane, metaphenylenediamine, diaminodiphenylsulfone, isophoronediamine, norbornenediamine and diaminodiethyl diphenylmethane. These may be used singly or in combinations of two or more thereof.

When an amine is used as the curing agent (B), the equivalent ratio (amine/epoxy group, molar ratio) of an amino group of the amine to an epoxy group of the epoxy resin (A) is preferably 0.3 to 1.5, more preferably 0.4 to 1.0, and further more preferably 0.5 to 1.0 from the viewpoint of curability, adhesion, preservation stability or the like.

The cyanate ester resin used as the curing agent (B) in the present invention is not particularly limited and a publicly-known resin can be used as long as it has two or more cyanato groups in one molecule. Examples of the cyanate ester resin include a bisphenol A-based cyanate ester resin, a bisphenol F-based cyanate ester resin, a bisphenol M-based cyanate ester resin, a bisphenol P-based cyanate ester resin, a bisphenol E-based cyanate ester resin, a phenol novolac-based cyanate ester resin, a cresol novolac-based cyanate ester resin, a dicyclopentadiene novolac-based cyanate ester resin, a tetramethyl bisphenol F-based cyanate ester resin, a bisphenol-based cyanate ester resin, a naphthol aralkyl-based cyanate ester resin and prepolymers thereof, and the cyanate ester resin may be used alone or by mixing two or more kinds thereof, as appropriate. Among these, an α-naphthol aralkyl-based cyanate ester resin (which may be a mixture of compounds in which n is different) represented by the following general formula (II) is particularly preferable from the viewpoint of high glass transition temperature, water absorption rate, heat resistance in moisture absorption, flame resistance, low thermal expansion, high insulation properties or the like.

[Formula 4]

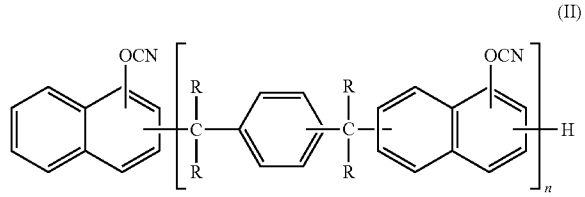

(II)

wherein R represents a hydrogen atom or a methyl group, and n represents an integer of 1 to 50.

The content of the curing agent (B) is not particularly limited, but is preferably 10 to 90 parts by mass, and more preferably 30 to 70 parts by mass based on 100 parts by mass of a total of the epoxy resin (A) and the curing agent (B). The content is preferably 10 parts by mass or more from the viewpoint of improving the heat resistance of the resultant laminate, and is preferably 90 parts by mass or less from the viewpoint of preventing a reduction in solvent solubility, curability, moisture resistance or the like.

First Filler (C)

The first filler (C) used in the present invention is borate particles coated with hexagonal boron nitride, and the borate particles is preferably magnesium or calcium borate particles.

The borate particles coated with the hexagonal boron nitride have a structure in which the borate as a core is coated with scale-like hexagonal boron nitride to form a shell. The ratio of the core portion is preferably 10 to 80% in terms of the area occupancy of particle cross-section. Further, the thickness of the shell portion is preferably a few to a few tens of μm.

As the borate particles coated with hexagonal boron nitride, commercially available products can be used, and examples thereof include SGPS made by Denki Kagaku Kogyo Kabushiki Kaisha.

The borate particles coated with hexagonal boron nitride have excellent processability of the printed wiring board obtained by the resin composition, thereby making it possible to improve thermal conductivity and to achieve decreased thermal expansion.

While the Graphite Index (GI) of the first filler (C) is not particularly limited, the Graphite Index (GI) by powder X-ray diffractometry of the first filler (C) is particularly preferably 2.5 or less from the viewpoint of heat conductivity.

The content of the first filler (C) is preferably 1 to 400 parts by mass, and more preferably 20 to 350 parts by mass based on 100 parts by mass of a total of the epoxy resin (A) and the curing agent (B) from the viewpoint of thermal conduction property, thermal expansion properties, processability and the appearance of a cured material.

Second Filler (D)

The second filler (D) used in the present invention is not particularly limited as long as used commonly. Specific examples thereof include an inorganic filler as exemplified by alumina, silicas such as natural silica, molten silica, amorphous silica and hollow silica, a metal hydrate such as aluminum hydroxide, an aluminum hydroxide heat-treated product (a product obtained by heat-treating aluminum hydroxide to reduce part of water of crystallization), boehmite and magnesium hydroxide, a molybdenum compound such as molybdenum oxide and zinc molybdate, zinc borate, zinc stannate, aluminum oxide, clay, kaolin, magnesium oxide, aluminum nitride, silicon nitride, talc, calcined clay, calcined kaolin, calcined talc, mica, short glass fibers (fine glass powders such as E glass and D glass) and hollow glass, and an organic filler as exemplified by a rubber powder such as styrene type, butadiene type and acrylic type, a core shell-based rubber powder, a silicone resin powder, a silicone rubber powder and a silicone composite powder. Particularly, in order to enhance the thermal conductivity, alumina, a metal hydrate such as aluminum hydroxide, an aluminum hydroxide heat-treated product (a product obtained by heat-treating aluminum hydroxide to reduce part of water of crystallization), boehmite and magnesium hydroxide, zinc borate, alumina, magnesium oxide, aluminum nitride, silicon nitride, calcined talc or the like is preferable, and among these, alumina is preferable from the viewpoint of the thermal conduction property.

The average particle size ($D_{50}$) of the second filler (D) is preferably 0.1 to 10 μm, and more preferably 0.2 to 7 μm. The second filler (D) may be used in combination of fillers with varied particle size distributions and average particle sizes, as appropriate. A spherical inorganic filler is further more preferable in order to reduce a specific surface area. In addition, when the second filler (D) is alumina, the average particle size ($D_{50}$) thereof is preferably 0.1 to 10 μm, and more preferably 0.2 to 7 μm. This is because the fluidity of the resin composition can be satisfactorily maintained, and the use in combination with the first filler (C) makes it possible to increase the volume ratio of the inorganic filler in a resin solid component to significantly raise the thermal conductivity. Here, the $D_{50}$ is a median diameter, and is a diameter that the large side and the small side when the particle size distribution of powder measured is divided into two sections are equivalent. Generally, the $D_{50}$ is measured by a wet laser diffraction/scattering method.

Further, using alumina in combination with magnesium oxide or aluminum nitride makes it possible to further enhance the thermal conductivity of the resin composition.

The content of the second filler (D) is preferably 1 to 700 parts by mass, and more preferably 50 to 600 parts by mass based on 100 parts by mass of a total of the epoxy resin (A) and the curing agent (B) from the viewpoint of thermal conduction property, thermal expansion properties, processability and the appearance of a cured material.

Wetting Dispersant (E)

While the wetting dispersant (E) used in the present invention is not particularly limited, a dispersion stabilizer used for coating materials may be preferably employed. Above all, a polymer wetting dispersant having an acid group is preferable, and a polymer wetting dispersant having an acid value of 20 to 200 mgKOH/g is more preferable. Specific examples thereof include polymer wetting dispersants made by BYK Japan K.K., for example, BYK-W 161, BYK-W903, BYK-W940, BYK-W996, BYK-W9010, Disper-BYK110, Disper-BYK111 and Disper-BYK180. However, the polymer wetting dispersant is not particularly limited thereto. The wetting dispersant (E) may be used alone or in combinations of two or more thereof.

The content of the wetting dispersant (E) is not particularly limited, but is preferably 0.1 to 20 parts by mass, more preferably 0.5 to 10 parts by mass, and further more preferably 0.5 to 7 parts by mass based on 100 parts by mass of a total of the epoxy resin (A) and the curing agent (B) from the viewpoint of the dispersibility of an inorganic filler and the glass transition temperature of a cured material. If the content is 0.1 parts by mass or more, the effect of improving dispersibility of the inorganic filler can be enhanced more, and if the content is 20 parts by mass or less, the glass transition temperature of the cured material can be prevented from decreasing.

Other Components

The resin composition according to the present invention may further comprise a silane coupling agent to the extent that desired properties are not impaired. A silanol group of the silane coupling agent particularly shows affinity and reactivity with a material having a hydroxyl group on the surface, and thus has an effect in bonding of an organic material to an inorganic material. If the surface of the inorganic filler reacts with the silane coupling agent, the adhesion between a thermosetting resin and the inorganic filler will be improved. Furthermore, the heat resistance in moisture absorption and resistance to soldering heat of a printed wiring board may be improved.

The content of the silane coupling agent is preferably 0.3 to 20 parts by mass, and more preferably 0.5 to 15 parts by mass based on 100 parts by mass of a total of the epoxy resin (A) and the curing agent (B). If the content is 0.3 parts by mass or more, the adhesion between the resin and the inorganic filler can be improved more, and if the content is 20 parts by mass or less, the glass transition temperature of the cured material can be prevented from decreasing.

The resin composition of the present invention may be used in combination with hardening accelerators in order to adjust a curing speed as appropriate to the extent that the desired properties are not impaired. These hardening accelerators are not particularly limited as long as used commonly as the hardening accelerators for a cyanate ester resin and an epoxy resin. Specific examples thereof include organic metal salts such as lead naphthenate, lead stearate, zinc naphthenate, zinc octoate, tin oleate, dibutyltin maleate, manganese octoate, cobalt naphthenate and iron acetylacetonate, imidazoles and derivatives thereof and tertiary amines.

The resin composition according to the present invention may further comprise a maleimide compound to the extent that the desired properties are not impaired. The compound is not particularly limited as long as it is a compound having two or more maleimide groups in one molecule. Specific examples thereof include bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, tris(4-maleimidephenyl)methane, prepolymers of these bismaleimide compounds or prepolymers of the bismaleimide compounds and amine compounds, and a bismaleimide-triazine resin. The compounds may be used alone or by mixing two or more kinds thereof, as appropriate. More preferable examples thereof include bis(4-maleimidephenyl)methane, 2,2-bis{4-(4-maleimidephenoxy)-phenyl}propane and bis(3-ethyl-5-methyl-4-maleimidephenyl)methane.

The resin composition according to the present invention may further comprise various polymer compounds such as other thermosetting resins, a thermoplastic resin and oligomer thereof, and elastomers, other flame resistant compounds, additives or the like to the extent that the desired properties are not impaired. These are not particularly limited as long as used commonly. Examples of the flame resistant compounds include phosphorus compounds such as phosphorous ester and phosphorous melamine, nitrogen-containing compounds such as melamine and benzoguanamine, oxazine ring-containing compounds and silicon-based compounds. As the additives, an ultraviolet absorber, an antioxidant, a photo-polymerization initiator, an optical whitening agent, a photo-sensitizer, a dye, a pigment, a thickener, a lubricant, a defoamer, a dispersant, a leveling agent, a gloss agent, a polymerization inhibitor or the like may be appropriately used in combination thereof at request.

The resin composition according to the present invention may further comprise an organic solvent to the extent that the desired properties are not impaired. The organic solvent is not particularly limited as long as it is a solvent compatible with a thermosetting resin (particularly, a mixture of a cyanate ester resin and an epoxy resin). Specific examples thereof include ketones such as acetone, methyl ethyl ketone, methyl isobutyl ketone and cyclohexanone, aromatic hydrocarbons such as benzene, toluene and xylene, and amides such as dimethylformamide and dimethylacetoamide.

The resin composition according to the present invention can be prepared in accordance with an ordinary method. A method for preparation thereof is not particularly limited as long as it is a method by which a resin composition uniformly containing the epoxy resin (A), the curing agent (B), the first filler (C), the second filler (D) and the wetting dispersant (E), and the aforementioned other optional components can be obtained. For example, the epoxy resin (A), the curing agent (B), the first filler (C), the second filler (D) and the wetting dispersant (E) are sequentially mixed in a solvent and are sufficiently stirred, thereby making it possible to easily prepare the resin composition of the present embodiment.

The organic solvent can be used as necessary during the preparation of the resin composition. The kind of organic solvents is not particularly limited as long as it is a solvent in which a mixture of the epoxy resin (A), curing agent (B), first filler (C), second filler (D) and wetting dispersant (E) can be dissolved or with which the mixture is compatible. Specific examples thereof are as described above.

It is to be noted that a publicly-known treatment (stirring, mixing, kneading treatment or the like) for dissolving or dispersing each of the components uniformly can be performed during the preparation of the resin composition. For example, a stirring dispersion method for resin compositions of the first filler (C) and second filler (D) makes it possible to enhance dispersibility to the resin composition by performing a stirring dispersion treatment using a stirred tank with a stirring machine having an appropriate stirring capability. The stirring, mixing and kneading treatments described above can be performed as appropriate using publicly-known apparatuses such as an apparatus aimed at the mixture of a ball mill, a beaded mill or the like, or such as a revolution/rotation-based mixing apparatus.

Prepreg

The prepreg according to the present invention is formed by impregnating the base material with the resin composition or applying the resin composition onto the base material. A method for producing the prepreg according to the present invention is not particularly limited as long as it is a method by which the resin composition comprising the epoxy resin (A), the curing agent (B), the first filler (C), the second filler (D) and the wetting dispersant (E) as indispensable components and a base material (F) are combined to produce the prepreg. Examples thereof include a method in which the resin composition, after impregnation of or application onto the base material (F), is semi-cured by heated in a drier at 100 to 200° C. for 1 to 60 minutes to produce the prepreg. The amount of the resin composition adhered to the base material (F) is preferably in a range of 40 to 95% by mass at the ratio of the resin composition to the total amount of the prepreg.

For the base material (F) used in the present invention, publicly-known base materials employed for various printed wiring board materials can be used. Examples thereof include inorganic fibers such as E glass, D glass, S glass, NE glass and quartz, and organic fibers such as polyimide, polyamide and polyester, which may be appropriately selected in accordance with intended use or performance and used singly or in combinations of two or more thereof. Particularly, as the organic fibers, poly(paraphenylene benzobisoxazole) fibers are preferable from the viewpoint of thermal conductivity, tensile elasticity modulus and flame resistance. Forms thereof include woven fabrics, non-woven fabrics, roving, chopped strand mat and surfacing mats. The thickness thereof is not particularly limited, but a thickness of approximately 0.01 to 0.3 mm is generally used. The base material of which the surface is treated with a silane coupling agent or the like, and a woven fabric to which an opening treatment is physically applied can be preferably used in terms of heat resistance in moisture absorption. Further, as the base material, a film such as polyimide, polyamide and polyester can be used. The thickness of the film is not particularly limited, but a thickness of approximately 0.002 to 0.05 mm is preferable, and a film of which the surface is treated with a plasma treatment or the like is more preferable.

Laminate

A laminate or a metal foil-clad laminate according to the present invention is laminate-molded using the aforementioned prepreg. Specifically, the laminate or the metal foil-clad laminate is produced by being laminate-molded in a constitution in which one or more of the aforementioned prepregs are laminated on top of one another, and a metal foil such as copper or aluminum is disposed on one surfaces or both surfaces of the prepregs at request. A metal foil to be used is not particularly limited as long as used in printed wiring board materials. As molding conditions, a technique for a laminate for a general printed wiring board and a multi-layer board is applicable. For example, a multistage press, a multistage vacuum press, continuous molding or an autoclave molding machine or the like is used, and generally, a temperature is in the range of 100 to 300° C., a pressure in the range of 2 to 100 kgf/cm$^2$, and a heating time is in the range of 0.05 to 5 hours. Further, the prepreg of the present invention and an internal layer wiring board prepared separately can be combined and laminate-molded to obtain a multi-layer board.

EXAMPLES

Hereinafter, the present invention will be specifically described using Examples and Comparative Examples. However, it is to be understood that the present invention is not limited thereto.

Synthesis Example 1

Synthesis of α-Naphthol Aralkyl-based Cyanate Ester Compound

A reactor equipped with a thermometer, a stirrer, a dropping funnel and a reflux condenser was previously cooled to 0 to 5° C. with a brine, to which 7.47 g (0.122 mol) of cyanogen chloride, 9.75 g (0.0935 mol) of 35% hydrochloric acid, 76 ml of water and 44 ml of methylene chloride were charged.

Under stirring while maintaining the temperature at −5 to +5° C. and the pH at 1 or lower in the reactor, a solution obtained by dissolving 20 g (0.0935 mol) of an α-naphthol aralkyl resin (SN 485, OH group equivalent: 214 g/eq. softening point: 86° C., Nippon Steel Chemical Co., Ltd.) and 14.16 g (0.14 mol) of triethylamine in 92 ml of methylene chloride was added dropwise through a dropping funnel over 1 hour, and after the completion of the dropwise addition, 4.72 g (0.047 mol) of triethylamine was further added dropwise thereto over 15 minutes.

After the completion of the dropwise addition, the solution was stirred at the same temperature for 15 minutes, and then the reaction solution was separated to obtain an organic layer. The organic layer thus obtained was washed with 100 ml of water twice, from which methylene chloride was then distilled off by an evaporator under a reduced pressure, and was finally concentrated to dryness at 80° C. for 1 hour to obtain 23.5 g of a cyanate ester product of cyanate of the α-naphthol aralkyl resin (α-naphthol aralkyl-based cyanate ester compound).

Example 1

40 parts by mass of the α-naphthol aralkyl-based cyanate ester compound obtained in Synthesis Example 1, 20 parts by mass of bis(3-ethyl-5-methyl-4-maleimidephenyl)methane (BMI-70, K.I CHEMICAL INDUSTRY CO., LTD.), 40 parts by mass of a biphenyl aralkyl-based epoxy resin (NC-3000-FH, Nippon Kayaku Co., Ltd.), 10 parts by mass of a silane coupling agent (Z6040, Dow Corning Toray Co., Ltd.) and 5 parts by mass of a wetting dispersant (BYK-W903, BYK Japan K.K.) containing an acid group were dissolved and mixed into methyl ethyl ketone, and 400 parts by mass of spherical alumina ($D_{50}$: 3.5 μm, AX3-15, Nippon Steel Materials Co., Ltd. Micron Co.), 50 parts by mass of calcium borate particles coated with hexagonal boron nitride ($D_{50}$: 12 μm, nitride boron purity of 80 to 85% by mass, calcium borate purity of 15 to 20% by mass, SGPS, Denki Kagaku Kogyo Kabushiki Kaisha), 0.01 parts by mass of NIKKA OCTHIX MANGANESE (Mn 8%) (NIHON KAGAKU SANGYO CO., LTD.) and 0.5 parts by mass of 2,4,5-triphenylimidazole (Tokyo Chemical Industry Co., Ltd.) were mixed to obtain varnish. The varnish was diluted with methyl ethyl ketone, impregnated in and applied to a mass of 47.2 g/m$^2$ of E glass cloth (Asahi Kasei E-materials Corp.), and heat-dried at 160° C. for 3 minutes to obtain a prepreg having 82% by mass of a resin content. Then, 8 sheets of the prepregs were laminated on top of one another, a 12 μm-electrolytic copper foil was disposed on the top and the bottom of the prepreg laminate, and press was performed at a temperature of 220° C. under pressure of 30 kgf/cm² for 120 minutes to obtain a copper-clad laminate having a thickness of 0.8 mm.

(Measurement Method)
1) Thermal conductivity: the density of the laminate obtained was measured, specific heat was measured with DSC (TA Instruments Q100-type), and further thermal diffusivity in a direction of the surface was measured with a Xenon Flash Analyzer (Bruker: LFA447 NanoFlash). Furthermore, the thermal conductivity in the surface direction was calculated from the following formula.

Thermal conductivity $(W/m \cdot K)$=density $(kg/m^3)$×specific heat $(kJ/kg \cdot K)$×thermal diffusivity $(m^2/S)$×1000

2) Peel strength: see JIS C6481 Test methods of copper-clad laminates for printed wiring boards, peel strength: 5.7
3) Heat resistance in moisture absorption: after a test piece from which all copper foils except for half of one surface of a 50 mm×50 mm sample were etching-removed was treated with a pressure cooker test machine (HIRAYAMA MANUFACTURING CORPORATION, PC-3 type) at 121° C. at 2 atmospheres for 3 hours, a change in the appearance after the test piece was immersed in solder at 260° C. for 60 seconds was visually observed (the number of blister occurrences/the number of tests).
4) Resistance to soldering heat: a specimen obtained by cutting a copper-clad laminate into a size of 50×50 mm was floated on a soldering tank at a temperature of 288° C., and the time until a blister occurred was measured. A specimen with no blister for 30 minutes or longer was rendered (○), and a specimen with a blister in less than 30 minutes was rendered (x).
5) Water absorption rate: water absorption rate after being treated with the pressure cooker test machine (HIRAYAMA MANUFACTURING CORPORATION, PC-3 type) at 121° C. at 2 atmospheres for 5 hours was measured in compliance with JIS C6481.
6) Glass transition temperature: measured by a DMA method in compliance with JIS C6481.
7) Burn test: evaluated in compliance with the UL94 vertical burn test method.

Example 2

An experiment similar to Example 1 was performed except for using 300 parts by mass of spherical alumina (AX3-15) and 100 parts by mass of calcium borate particles coated with hexagonal boron nitride (SGPS).

Example 3

An experiment similar to Example 2 was performed except for using 300 parts by mass of spherical alumina ($D_{50}$: 3 μm, DAW-03, Denki Kagaku Kogyo Kabushiki Kaisha) in place of 300 parts by mass of the spherical alumina (AX3-15).

Example 4

An experiment similar to Example 2 was performed except for using 300 parts by mass of non-spherical alumina ($D_{50}$: 3 μm, AA-3, Sumitomo Chemical Co., Ltd.) in place of 300 parts by mass of the spherical alumina (AX3-15).

Comparative Example 1

An experiment similar to Example 1 was performed except for using 50 parts by mass of scale-like boron nitride ($D_{50}$: 9 μm, HP-1, Mizushima Ferroalloy Co., Ltd.) in place of 50 parts by mass of calcium borate particles coated with hexagonal boron nitride (SGPS).

Comparative Example 2

An experiment similar to Example 2 was performed except for using 100 parts by mass of the scale-like boron nitride (HP-1) in place of 100 parts by mass of the calcium borate particles coated with the hexagonal boron nitride (SGPS).

Comparative Example 3

An experiment similar to Example 1 was performed except for using 50 parts by mass of scale-like boron nitride ($D_{50}$: 6 μm, HP-4W, Mizushima Ferroalloy Co., Ltd.) in place of 50 parts by mass of the calcium borate particles coated with the hexagonal boron nitride (SGPS).

Comparative Example 4

An experiment similar to Example 2 was performed except for using 100 parts by mass of the scale-like boron nitride (HP-4W) in place of 100 parts by mass of the calcium borate particles coated with the hexagonal boron nitride (SGPS).

Comparative Example 5

An experiment similar to Example 1 was performed except for using 500 parts by mass of the spherical alumina (AX3-15) and not using the calcium borate particles coated with the hexagonal boron nitride (SGPS).

Comparative Example 6

An experiment similar to Example 1 was performed except for not using the dispersant (BYK-W903).

TABLE 1

| | | | Example 1 | Example 2 | Example 3 | Example 4 | Comparative Example 1 | Comparative Example 2 | Comparative Example 3 | Comparative Example 4 | Comparative Example 5 | Comparative Example 6 |
|---|---|---|---|---|---|---|---|---|---|---|---|---|
| Evaluation Item | Thermal Conductivity | W/m · K | 3.0 | 4.0 | 3.8 | 4.5 | 3.5 | 5.5 | 2.8 | 3.6 | 2.0 | Poor Molding |
| | Peel Strength | kg/cm | 0.9 | 0.8 | 0.8 | 0.8 | 0.7 | 0.3 | 0.6 | 0.2 | 1.0 | |
| | Heat Resistance in moisture absorption | Number of Blister Occurrences/Number of Tests | 0/4 | 0/4 | 0/4 | 0/4 | 4/4 | 4/4 | 4/4 | 4/4 | 0/4 | |

TABLE 1-continued

|  |  | Example 1 | Example 2 | Example 3 | Example 4 | Comparative Example 1 | Comparative Example 2 | Comparative Example 3 | Comparative Example 4 | Comparative Example 5 | Comparative Example 6 |
|---|---|---|---|---|---|---|---|---|---|---|---|
| Solder Float (288° C.) |  | ○ | ○ | ○ | ○ | X | X | X | X | ○ |  |
| Water Absorption Rate | wt % | 0.3 | 0.3 | 0.3 | 0.3 | 0.5 | 0.7 | 0.4 | 0.6 | 0.3 |  |
| Glass Transition Temperature (DMA method) | ° C. | 260 | 260 | 260 | 260 | 260 | 260 | 260 | 260 | 260 |  |
| Flame Resistance | UL94 (Sheet Thickness 0.4 mmt) | V-0 | V-0 | V-0 | V-0 | V-0 | V-0 | V-0 | V-0 | V-0 |  |

The invention claimed is:

1. A resin composition comprising:
an epoxy resin (A) represented by the following general formula (I),

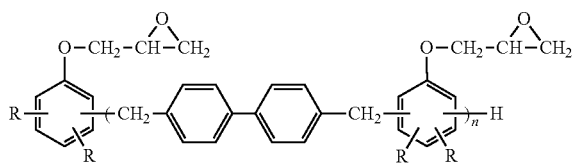

wherein a plurality of R are each independently present and represent a hydrogen atom, an alkyl group having 1 to 5 carbon atoms or a phenyl group; and n is an average value and represents $1<n\leq 20$;
a curing agent (B) comprising a cyanate ester compound represented by the following general formula (II),

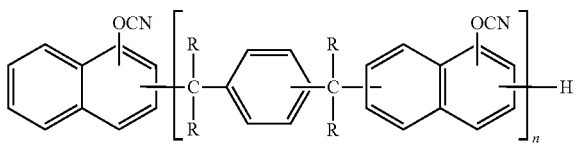

wherein R represents a hydrogen atom or a methyl group, and n represents an integer of 1 to 50;
a first filler (C);
a second filler (D); and
a wetting dispersant (E) comprising a copolymer containing at least one functional group comprising an acid group, wherein a content of the wetting dispersant (E) is 0.1 to 20 parts by mass based on 100 parts by mass of a total of the components (A) to (D);
wherein a content of the epoxy resin (A) is 10 to 90 parts by mass based on 100 parts by mass of a total of the epoxy resin (A) and the curing agent (B);
wherein a content of the curing agent (B) is 10 to 90 parts by mass based on 100 parts by mass of a total of the epoxy resin (A) and the curing agent (B);
wherein the first filler (C) is borate particles coated with hexagonal boron nitride, and the second filler (D) is at least one selected from the group consisting of alumina, aluminum nitride, boehmite, and silica, and a content of the first filler (C) is 50 to 350 parts by mass based on 100 parts by mass of a total of the epoxy resin (A) and the curing agent (B), and
further wherein a content of the second filler (D) is 50 to 700 parts by mass based on 100 parts by mass of a total of the epoxy resin (A) and the curing agent (B).

2. The resin composition according to claim 1, wherein the borate particles are magnesium or calcium borate particles.

3. The resin composition according to claim 1, wherein an average particle size ($D_{50}$) of the second filler (D) is 0.1 to 10 μm.

4. The resin composition according to claim 1, further comprising a silane coupling agent.

5. The resin composition according to claim 1, wherein the wetting dispersant (E) is a polymer wetting dispersant having an acid value of 20 to 200 mgKOH/g.

6. A prepreg formed by impregnating a base material (F) with the resin composition according to claim 1.

7. A laminate formed by laminate-molding the prepreg according to claim 6.

8. A metal foil-clad laminate formed by laminate-molding the prepreg according to claim 6 and a metal foil.

9. A prepreg formed by applying the resin composition according to claim 1 onto a base material (F).

10. A laminate formed by laminate-molding the prepreg according to claim 9.

11. A metal foil-clad laminate formed by laminate-molding the prepreg according to claim 9 and a metal foil.

* * * * *